United States Patent
Hsing et al.

(10) Patent No.: US 8,400,778 B2
(45) Date of Patent: Mar. 19, 2013

(54) LAYOUT SCHEMES AND APPARATUS FOR MULTI-PHASE POWER SWITCH-MODE VOLTAGE REGULATOR

(75) Inventors: Michael R. Hsing, Saratoga, CA (US); Anthonius Bakker, Morgan Hill, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 384 days.

(21) Appl. No.: 12/698,819

(22) Filed: Feb. 2, 2010

(65) Prior Publication Data

US 2011/0188218 A1   Aug. 4, 2011

(51) Int. Cl.
*H01R 9/00* (2006.01)

(52) U.S. Cl. ........ 361/772; 361/271; 361/748; 257/150; 257/334; 257/502; 257/664; 257/686; 257/691; 257/787; 250/551; 323/222; 323/282; 330/251

(58) Field of Classification Search .................. 361/772, 361/271, 748; 257/150, 334, 502, 664, 686, 257/691, 787; 250/551; 323/222, 282, 288; 330/251

See application file for complete search history.

(56) References Cited

U.S. PATENT DOCUMENTS

| | | | | |
|---|---|---|---|---|
| 5,523,617 A * | 6/1996 | Asanasavest | ........... | 257/666 |
| 5,528,538 A * | 6/1996 | Sakuta et al. | ........... | 365/189.09 |
| 5,633,825 A * | 5/1997 | Sakuta et al. | ........... | 365/189.09 |
| 5,677,616 A * | 10/1997 | Ooiwa | ........... | 322/17 |
| 5,719,487 A * | 2/1998 | Sato et al. | ........... | 322/28 |
| 5,747,779 A * | 5/1998 | Asanasavest | ........... | 219/603 |
| 5,973,547 A * | 10/1999 | Ang et al. | ........... | 327/538 |
| 6,028,417 A * | 2/2000 | Ang et al. | ........... | 323/209 |
| 6,198,325 B1 * | 3/2001 | Ang et al. | ........... | 327/259 |
| 6,313,527 B1 * | 11/2001 | Han et al. | ........... | 257/723 |
| 6,384,675 B1 * | 5/2002 | Ang et al. | ........... | 327/562 |
| 6,396,137 B1 * | 5/2002 | Klughart | ........... | 257/691 |
| 6,399,421 B2 * | 6/2002 | Han et al. | ........... | 438/112 |
| 6,509,785 B2 * | 1/2003 | Ang et al. | ........... | 327/538 |
| 6,885,016 B2 * | 4/2005 | Worley et al. | ........... | 250/551 |
| 7,659,144 B2 * | 2/2010 | Shirai et al. | ........... | 438/107 |
| 7,902,627 B2 * | 3/2011 | Dong et al. | ........... | 257/499 |
| 2001/0054761 A1 * | 12/2001 | Han et al. | ........... | 257/723 |
| 2002/0008565 A1 * | 1/2002 | Ang et al. | ........... | 327/530 |
| 2002/0014881 A1 * | 2/2002 | Asada | ........... | 323/273 |
| 2002/0055246 A1 * | 5/2002 | Jiang et al. | ........... | 438/597 |
| 2002/0163322 A1 * | 11/2002 | Saxelby et al. | ........... | 323/225 |
| 2003/0042437 A1 * | 3/2003 | Worley et al. | ........... | 250/551 |
| 2004/0104489 A1 * | 6/2004 | Larking | ........... | 257/787 |
| 2004/0140792 A1 * | 7/2004 | Abdoulin | ........... | 323/282 |
| 2004/0222484 A1 * | 11/2004 | Saxelby et al. | ........... | 257/502 |
| 2004/0227547 A1 * | 11/2004 | Shiraishi et al. | ........... | 327/110 |
| 2004/0232538 A1 * | 11/2004 | Linke | ........... | 257/686 |
| 2005/0046005 A1 * | 3/2005 | Bowen | ........... | 257/686 |
| 2005/0184367 A1 * | 8/2005 | Bowen | ........... | 257/666 |
| 2005/0213280 A1 * | 9/2005 | Azrai et al. | ........... | 361/271 |
| 2005/0253457 A1 * | 11/2005 | Pierret et al. | ........... | 307/10.1 |
| 2005/0271149 A1 * | 12/2005 | Dupuis | ........... | 375/258 |
| 2005/0272378 A1 * | 12/2005 | Dupuis | ........... | 455/67.15 |
| 2006/0125451 A1 * | 6/2006 | Tabaian et al. | ........... | 323/222 |
| 2007/0012947 A1 * | 1/2007 | Larking | ........... | 257/150 |

(Continued)

*Primary Examiner* — Xiaoliang Chen

(74) *Attorney, Agent, or Firm* — Perkins & Coie LLP

(57) ABSTRACT

A multi-phase voltage regulator is disclosed where each phase is comprised of an array of high and low side transistors that are integrated onto a single substrate. Further, a system of mounting the voltage regulator onto a flip chip and lead frame is disclosed wherein the source and drain lines form an interdigital pattern.

8 Claims, 10 Drawing Sheets

U.S. PATENT DOCUMENTS

| | | | |
|---|---|---|---|
| 2007/0196950 A1* | 8/2007 | Shirai et al. | 438/106 |
| 2008/0013635 A1* | 1/2008 | Dupuis | 375/258 |
| 2008/0048218 A1* | 2/2008 | Jiang | 257/288 |
| 2008/0119142 A1* | 5/2008 | Dupuis | 455/67.15 |
| 2008/0135991 A1* | 6/2008 | Harnden et al. | 257/666 |
| 2008/0150100 A1* | 6/2008 | Hung et al. | 257/667 |
| 2008/0157308 A1* | 7/2008 | Wang | 257/676 |
| 2008/0246127 A1* | 10/2008 | Larking | 257/664 |
| 2008/0252372 A1* | 10/2008 | Williams | 330/251 |
| 2008/0265857 A1* | 10/2008 | Tabaian et al. | 323/288 |
| 2009/0033300 A1* | 2/2009 | Kubo et al. | 323/282 |
| 2009/0039711 A1* | 2/2009 | Williams | 307/113 |
| 2009/0039869 A1* | 2/2009 | Williams | 324/123 R |
| 2009/0050960 A1* | 2/2009 | Pattanayak et al. | 257/334 |
| 2009/0093090 A1* | 4/2009 | Ewe et al. | 438/123 |
| 2009/0096435 A1* | 4/2009 | Ueunten | 323/282 |
| 2009/0096511 A1* | 4/2009 | Ueunten | 327/543 |
| 2009/0184760 A1* | 7/2009 | Hauenstein | 327/594 |
| 2009/0218676 A1* | 9/2009 | Muto et al. | 257/693 |
| 2009/0243764 A1* | 10/2009 | Hauenstein | 333/24 C |
| 2010/0118918 A1* | 5/2010 | Dupuis | 375/130 |
| 2010/0133674 A1* | 6/2010 | Hebert et al. | 257/686 |
| 2010/0165585 A1* | 7/2010 | Lin et al. | 361/748 |
| 2011/0188218 A1* | 8/2011 | Hsing et al. | 361/772 |

\* cited by examiner

LAYOUT SCHEMES AND APPARATUS FOR MULTI-PHASE POWER SWITCH-MODE VOLTAGE REGULATOR

TECHNICAL FIELD

The present invention relates to voltage regulators, and more particularly, to multi-phase DC-DC regulators with monolithic solutions.

BACKGROUND

Multi-phase voltage regulators are used in high-current and low voltage applications, typically 25-150 A and 0.8-1.2V. The main advantages for multi-phase voltage regulators are to lower the ripple at the output, to reduce the bulk capacitors at the input and the output, and to increase efficiency.

FIG. 1 shows a schematic diagram of a multi-phase switch-mode voltage regulator circuit 100 which includes a controller and n phases (11 to 1n) with each phase comprising a high-side metal oxide semiconductor field effect transistor (MOSFET) switch 101, a low-side metal oxide semiconductor field effect transistor (MOSFET) switch 102, a high side gate driver circuit 103 for switch 101, a low side gate driver circuit 104 for switch 102 and an inductor (L1 . . . Ln). The controller sends out gate drive signals to the high side gate driver circuits 103 and low side gate driver circuits 104 of all the phases. Each high side gate driver circuit 103 is connected in serial and controls the gate of a high side switch 101 to turn on or turn off the switch according to the gate drive signal. Each low side gate driver circuit 104 is connected in serial and controls the gate of the low side switch 102 to turn on or turn off the switch.

For the first phase 11 as shown in FIG. 1, the input terminal of high side gate driver circuit 103 receives an inverse gate drive signal $\overline{PMW}$ that drives the gate of high side switch 101. The input terminal of low side gate driver circuit 104 receives a gate drive signal PWM that drives low side switch 102. The high side gate driver circuit 103 and low side gate driver circuit 104 in FIG. 1 are inverters. Accordingly, high side gate driver circuit 103 turns on high side switch 101 at a logic Low of $\overline{PMW}$ with the gate of high side switch 101 pulled up to the voltage at the node BST1. Further, the high side switch 101 at a logic HIGH of $\overline{PMW}$ with the gate of high side switch 101 pulled down to the voltage at the node SW1. Meanwhile, when $\overline{PMW}$ is LOW, PWM is HIGH, and low side switch 102 is turned off. And low side switch 102 is turned on when PWM is LOW. The drain of high side switch 101 is connected to receive an unregulated input voltage VIN. The source of high side switch 101 is connected to the drain of low side switch 102 at the first switch node SW1. The source of low side switch 102 is connected to electrical ground GND. The voltage at SW1 is filtered by the inductor 105 and the output capacitor Cout and contributes to the output voltage Vout together with the other phases.

In the prior art, the gate driver circuits and the switches are laid out separately as discrete components. They are relatively large in order to carry the current required. Accordingly, the interconnection resistance and the gate coupling resistance capacitance product are high, which leads to low efficiency and large volume.

On the other hand, integrating a driver closely with the switch (DrMOS) reduces parasitic inductance and gate coupling resistance capacitance product, therefore improving efficiency of the converter. One DrMOS solution uses Multi-Chip Modules (MCM) as a well known technology which attaches the driver chip and the switch chip on a same lead frame to reduce parasitic inductance. However, this approach is not compact enough, and the current carrying ability is limited. Further, when the MCM solution for DrMOS is used in multi-phase systems, the size for the whole system is large.

Another difficulty with multi-phase systems is the increased cost, which is a result of multiple inductors, switches, input ceramic capacitors and large sized package. Thus, while keeping the advantage of multi phases, small size, high efficiency and low cost are also desired in multi-phase converters.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
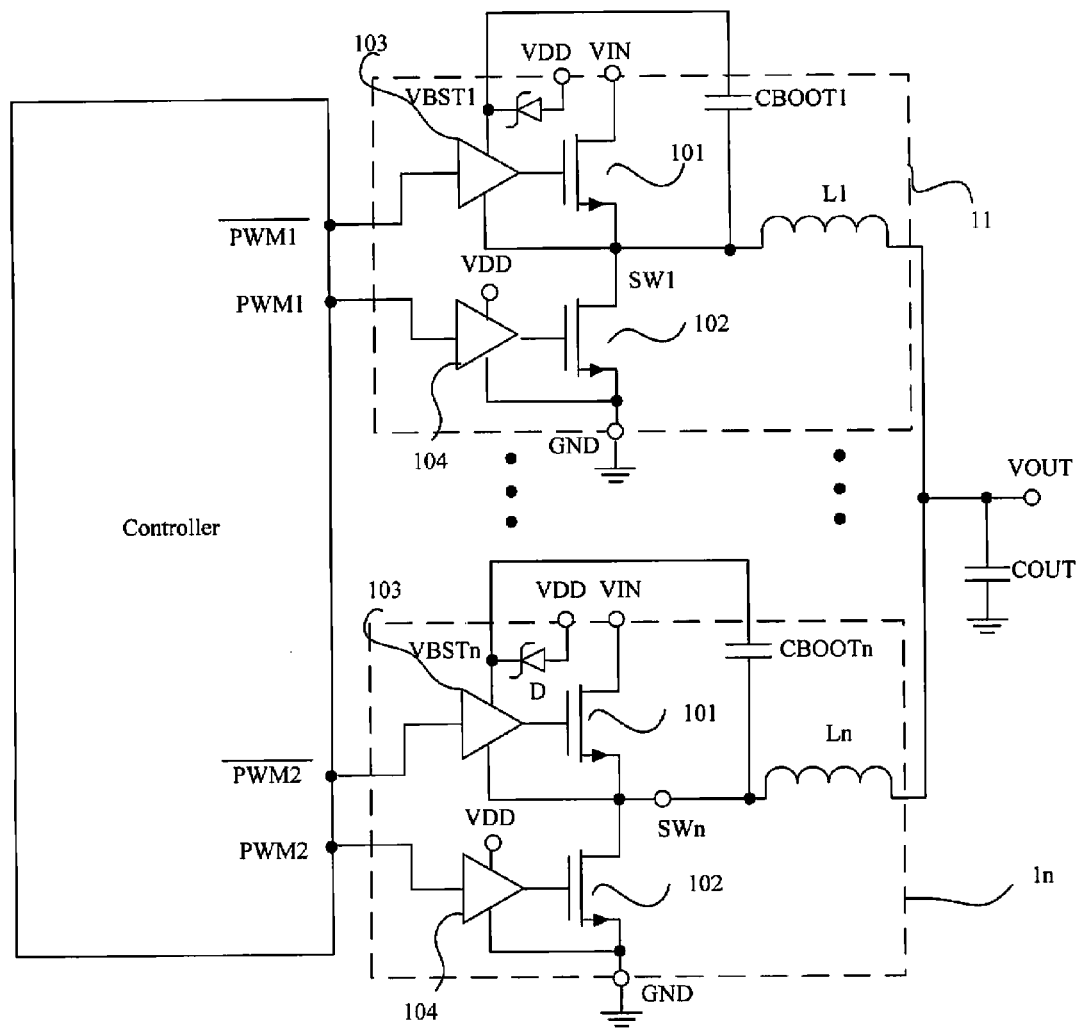
FIG. 1 illustrates a schematic diagram of a multi-phase switch-mode voltage regulator circuit as a prior art where the switch and the gate driver circuit are separated as discrete components.
Figure 2:
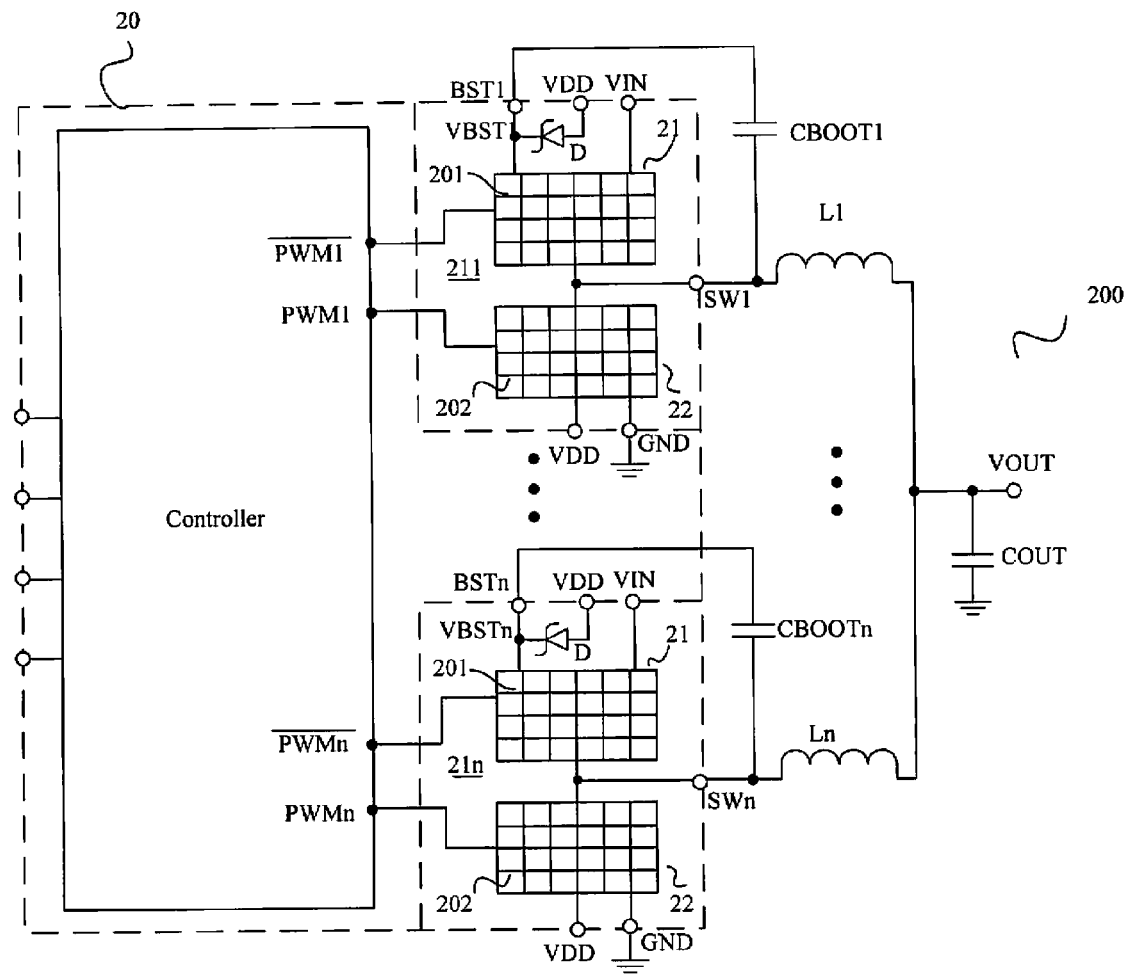
FIG. 2 illustrates a schematic diagram of multi-phase power switch-mode voltage regulator system where each phase comprises an array of high side switching elements and an array of low side switching elements in accordance with one embodiment of the present invention.

Now referring to FIG. 2, a multi-phase power switch-mode voltage regulator system 200 is illustrated according to one embodiment of the present invention. The multi-phase power switch-mode voltage regulator system 200 comprises a controller, n phases of gate drivers and switches parts 211-21n, inductors L1-Ln for each phase respectively and an output capacitor COUT. Each phase of the regulator comprises an array of high side switching elements 21 and an array of low side switching elements 22. The high side switching elements 21 comprises multiple high side switching elements 201 connected in parallel and arranged in rows and columns. Also, the low side switching elements array 22 comprises multiple low side switching elements 202 connected in parallel and arranged in rows and columns. Each switching element is shown as one square in the arrays 21 and 22. In one embodiment, the structures of all the switching elements are manufactured substantially to be similar. Each switching element 201 or 202 further comprises a gate driver and a MOSFET transistor connected in serial. The high side switching elements array 21 functions as the high side gate driver 103 and the high side switch 101 in the prior art and the low side switching elements array 22 functions as the low side gate driver 104 and the low side switch 102 in the prior art. In the present invention, the size of a gate driver and a MOSFET transistor in one switching element is substantially small compared to the discrete components in the prior art and the gate driver is placed substantially close to MOSFET transistor in a switching element. Thus, the interconnection resistance between gate driver and MOSFET transistor is reduced. Also, with the small size, the coupling resistance capacitance product is reduced, which lowers down the switching loss and further improves the efficiency.

Continue with FIG. 2, for the first phase 211, the high side switching elements array 21 receives a gate drive signal $\overline{PMW1}$, an input voltage at node VIN, a bootstrap voltage VBST1 at node BST1 and a power supply voltage at node VDD, and, further contributes to the switching signal at node SW1. The low side switching elements array 22 receives a gate drive signal PWM1, a power supply voltage at node VDD and a ground signal at node GND, and, further contributes to the switching signal at node SW1. The other phases in the multi-phase power switch-mode voltage regulator system 200 share the same nodes of VIN, VDD and GND in one embodiment. Both VDD node and BST1-BSTn nodes are power supply nodes, electrically coupled to deliver correct voltage to high side gate drivers and low side gate drivers. In other embodiments, the power supply nodes can be other forms with the function to deliver power to the gate drivers.

In operation, for the first phase 211, high-side switching elements 201 and low-side switching elements 202 are complementarily turned on and off. The currents from high-side switching elements 201 and from low-side switching elements 202 are summed up at the switch node SW1. The total currents are delivered to the output inductor L1 to charge and discharge output capacitor (COUT). In one embodiment, the other phases 212-21n function the same way with the first phase 211. The gate drive signals PWM2-PWMn have the same duty cycle with the gate drive signal PWM1 and have predetermined phase differences programmed by the programmable controller in one embodiment. As a result, the load sees an average output voltage proportional to the duty cycle of the gate drive signal and input voltage VIN.

Figure 3:
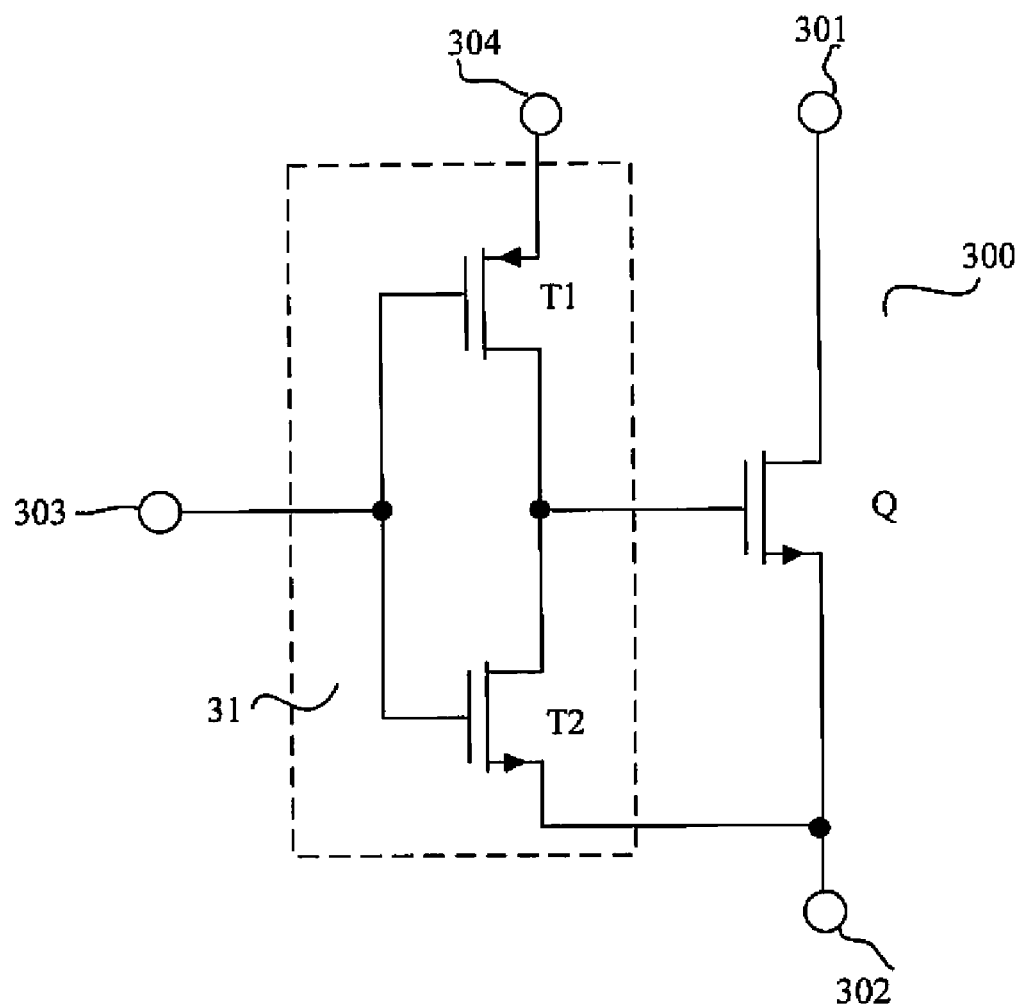
FIG. 3 illustrates a configuration of a switching element each comprising a gate driver and a MOSFET transistor in accordance with one embodiment of the present invention.

In one embodiment, a high side switching element 201 or a low side switching element 202 has a configuration as illustrated in FIG. 3. The switching element 300 comprises a gate driver 31 and a MOSFET transistor Q connected in serial, with the output of the gate driver 31 controlling the gate of Q. The gate driver 31 is an inverter in one embodiment which comprises a P typed high transistor T1 and an N typed low transistor T2. The gates of T1 and T2 are connected together to receive a gate drive signal at 303. The drains of T1 and T2 are connected together as the output of the gate driver 31 and are connected to the gate of the MOSFET transistor Q. The source of T2 is connected to the source of Q. When switching element 300 is a high side switching element 201, the gates of T1 and T2 receive an inverse gate drive signal at 303, such as $\overline{PMW1}$ for the first phase 211. The drain of Q 301, the source of Q 302 and the source of T1 304 are connected to nodes of VIN, SW1 and BST1 respectively. When switching element 300 is a low side switching element 202, the gates of T1 and T2 receive a gate drive signal at 303, such as PWM1 for the first phase. The drain of Q 301, the source of Q 302 and the source of T1 304 are connected to nodes of SW1, GND and VDD respectively. In yet another embodiment, the gate driver 31 comprises several inverters connected in parallel.

Referring back to FIG. 2, in one embodiment, each phase 211-2n1 further comprises a diode D which has its anode connected to the node VDD and has its cathode connected to the boost strap node of that phase (BST1-BSTn). In one embodiment, the diode D is a Schottky diode.

In one embodiment, the controller and the switching element parts of multi phases 211-21n are manufactured on the same semiconductor substrate to act as a multi-phase power switch-mode voltage regulator integrated circuit 20. The multi-phase power switch-mode voltage regulator integrated circuit 20 comprises input/output nodes of input voltage node VIN; the switch nodes SW1-SWn, one for each phase; a ground node GND; the power supply nodes VDD, and BST1-BSTn to electrically communicate with the external circuits as illustrated. The integrated circuit 20 further can have other input/output nodes.

Figure 4:
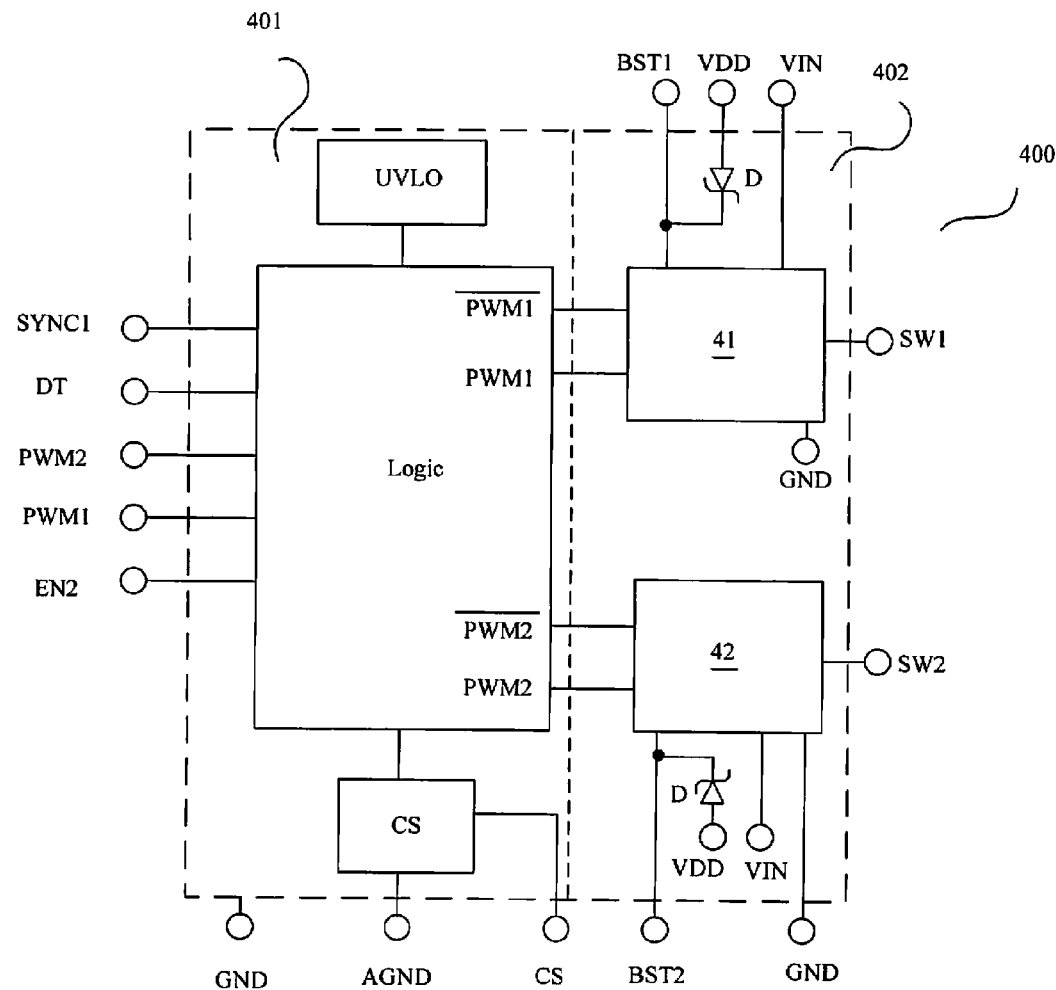
FIG. 4 shows a block diagram of a two-phase power switch-mode voltage regulator integrated circuit as one embodiment of the present invention.

FIG. 4 shows a block diagram of a two-phase power switch-mode voltage regulator integrated circuit 400 as one embodiment of the present invention. The two-phase power switch-mode voltage regulator integrated circuit 400 is only illustrative, and the contents that will be described in the followings are also applicable to three-phase voltage regulator or multi-phase regulator with more than three phases without departing from the spirit and the scope of the invention. The integrated circuit 400 comprises the controller 401 and the switching elements part 402. The switching elements part 402 further comprises switching elements for the first phase 41 and switching elements for the second phase 42. The first phase 41 and second phase 42 each has a configuration as the phase 211 or phase 21n as illustrated in FIG. 2. In one embodiment, the different phases have different configurations or have different number of switching elements. Each phase further comprise a Schottky diode D, a regular diode D or a switch D functioning as bootstrap charger in one embodiment. The controller 401 further comprises the control logic circuit (Logic), the under voltage lockout protection circuit (UVLO) and current sense circuit (CS) in one embodiment. The control logic circuit is connected to the UVLO circuit and CS circuit. CS circuit is coupled to receive the output current signal at CS node and AGND node and performs current sensing for current monitoring or used for adaptive dead time control as examples. The control logic circuit is electrically coupled to receive external signals at the input nodes of SYNC1, DT, PWM2, PWM1, EN2, and, puts out an inverse gate drive signal $\overline{\text{PMW1}}$ to the high side gate drivers of the first phase 41 and a gate drive signal PWM1 to the low side gate drivers of the first phase 41, an inverse gate drive signal $\overline{\text{PMW2}}$ to the high side gate drivers of the second phase 42 and a gate drive signal PWM2 to the low side gate drivers of the second phase 42.

In one embodiment, the control logic circuit is programmable to control the multi phases. The switching elements part 402 comprises input nodes of bootstrap nodes BST1 and BST2 for delivering bootstrap voltage; VDD node for supplying power for the gate drivers; and input voltage node VIN to receive the input voltage and is connected to the drains of the high side MOSFET transistors in phase 41 and 42. The switching elements part 402 further comprises output nodes of SW1 and SW2 for delivering switching signals to the output inductors of each phase. Besides the nodes of VIN, VDD, GND, SW1, SW2, BST1 and BST2 as described above, the multi-phase power switch-mode voltage regulator further can comprise at least one drive signal node PWM1 and PWM2 to receive the gate drive signal and after processed by the control logic circuit, controls the gate drivers in each phase; at least one dead time control node DT, used to set the dead time; a current sense node CS coupled to the current sense circuit (CS) to sense the output current; and at least one phase control node EN2, SYNC1, electrically coupled to control the status of the phases 41 and 42. In one embodiment, each node comprises electrical pads adapted to receive flip chip bumps that electrically couple the integrated circuit 400 to external circuits.

Figure 5A:
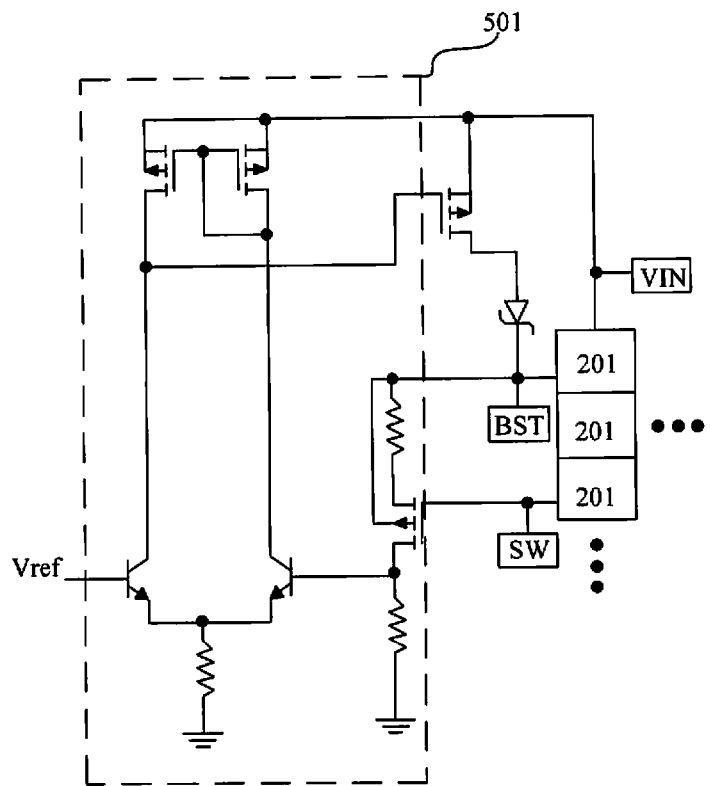
FIG. 5A illustrates a floating bootstrap charging circuit to regulate correct voltage levels across each high side switching element in a phase as one embodiment.
Figure 5B:
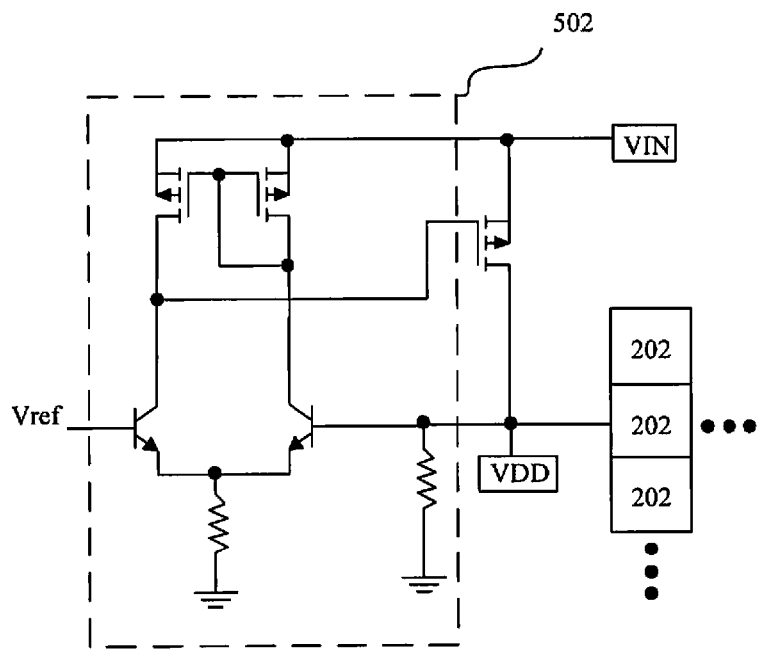
FIG. 5B illustrates a charging circuit to regulate correct voltage levels to all of the low side gate drivers in a phase as one embodiment.

In yet another embodiment, each phase 41 or 42 further comprises a floating bootstrap charging circuit, electrically coupled to the high side switching elements 201, operable to regulate correct voltage levels across each pair of MOSFET transistor and gate driver. A floating bootstrap charging circuit 501 is shown in FIG. 5A as one embodiment where VIN, BST and SW in the blocks represent the input voltage node, the bootstrap node and the switch node for that phase. In one embodiment, each phase 41 or 42 further comprises a charging circuit, electrically coupled to regulate correct voltage levels to all of the low side gate drivers in that phase. A charging circuit 502 is shown in FIG. 5B as one embodiment where VIN and VDD in the blocks represent the input voltage node and the power supply node for the low side switching elements 202.

Figure 6:
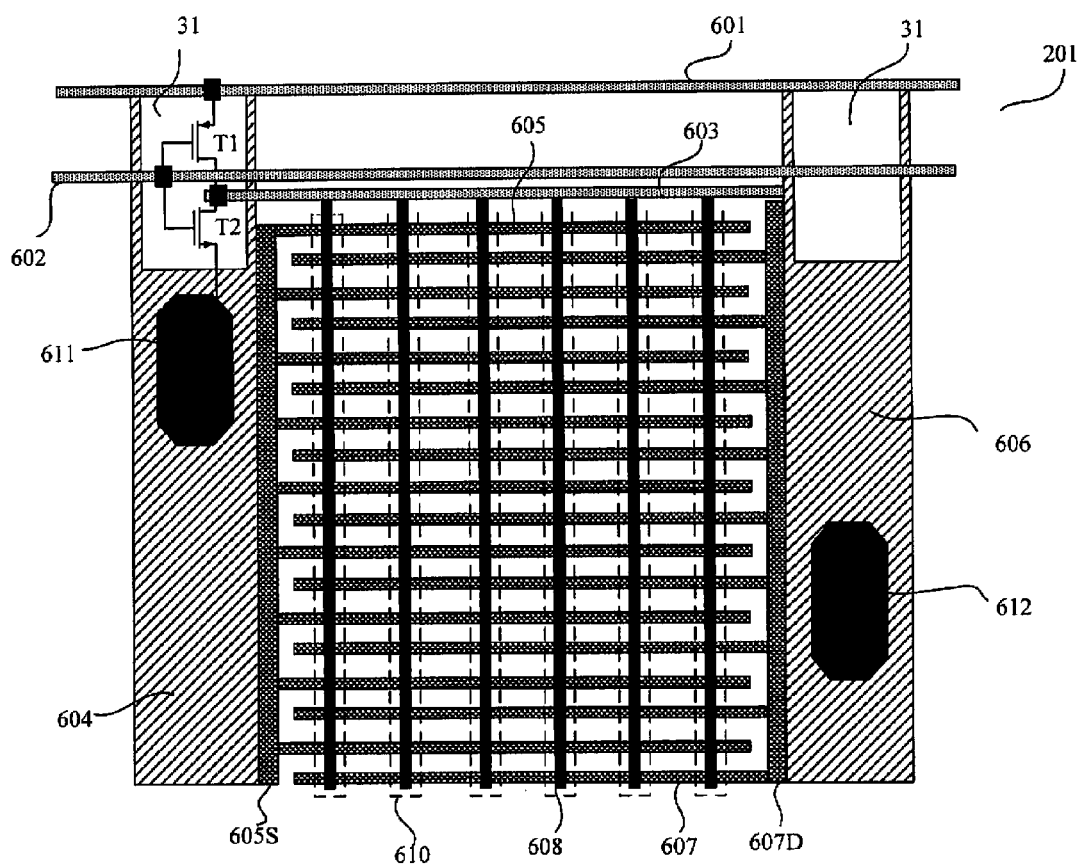
FIG. 6 is a top plan view of a layout scheme for a switching element in accordance with one embodiment of the present invention.

Now referring to FIG. 6, a top plan view of a layout scheme for a high-side switching element 201 in accordance with one embodiment of the present invention is illustrated. In one embodiment of the present invention, all high-side switching transistors 201 and all low side switching elements 202 are fabricated by the same process. Thus, the layout scheme shown in FIG. 6 for an exemplary switching element 201 is representative of both high side switching elements 201 and low side switching elements 202. In one embodiment, the MOSFET transistors of switching elements are N typed channel double diffused metal sxide semiconductors (NDMOS) as shown in FIG. 6.

Each DMOS switching element 201 includes a large number of discrete DMOS transistors (cells) 610 laid out successively and next to one another which function as a MOSFET transistor as shown in FIG. 3. More particularly, in FIG. 6 discrete DMOS transistor 610 runs "north-south" and parallel to one another. Each discrete DMOS transistor 610 includes a source electrode 605, a gate electrode 608, and a drain electrode 607. Gate electrodes 608 are of polysilicon material (gate poly) parallel to one another that also run north-south. In one embodiment, gate electrode 608 further comprises many elongated gate islands (not shown) so that the size of each discrete DMOS transistors 610 is smaller. Source electrodes 605 are disposed parallel to one another, running west-east (left to right in FIG. 6) and having a finger shaped structure. Similarly, drain electrodes 607 are disposed parallel to one another, running east-west (right to left) and having a finger shaped structure. Accordingly, source electrodes 605 and drain electrodes 607 form a metallization inter-digital pattern that is laid over gate electrodes 608. Source electrodes 605 are originated from a source metal line 605S that is electrically coupled to a source metal power bus 604.

A switch contact pad (SW) 611 is placed on source metal power bus 604 for picking up all source electrodes 605 within high side switching element 201. As such, switch contact pad (SW) 611 behaves as a switch node that communicates with source electrodes 605. Drain electrodes 607 are originated from a drain metal line 607D that is electrically coupled to a drain metal power bus 606. An input contact pad (IN) 612 is placed on drain metal power bus 606 for picking up all drain electrodes 607 within one high side switching element 201. As such, input contact pad (IN) functions as an input voltage node that communicates with drain electrodes 607.

Still referring to FIG. 6, a gate driver 31 as illustrated in FIG. 3 is integrated to each high side DMOS switching element 201 on the same semiconductor die. In one embodiment, gate driver 31 is an inverter that includes a pull-up PMOS transistor T1 connected to a pull-down NMOS transistor T2. A power supply metal bus 601 spans across the semiconductor die of that phase to distribute a supply voltage VBST to every single high side gate driver 31 in a phase. An input signal metal bus 602 also runs across the semiconductor die of that phase, connected to the input (gate connection) of gate driver 31 to provide gate drive signal (PWM or $\overline{\text{PMW}}$) to each gate driver 31 within high side DMOS switching element 201. A gate driver metal bus 603 connected to the output of gate driver 31 and drives the gate electrodes 608 to drive all discrete DMOS transistors 610 in a switching element 201. In one embodiment of the present invention, inter-digital metallization pattern of the sources 605 and drains 607, and gate poly lines 608 are laid in perpendicular to each other.

For low side DMOS switching element 202, the pad 611 communicating with source electrodes 605 functions as the ground contact pad (GND) and the pad 612 functions as the switch contact pad (SW) respectively.

Figure 7A:
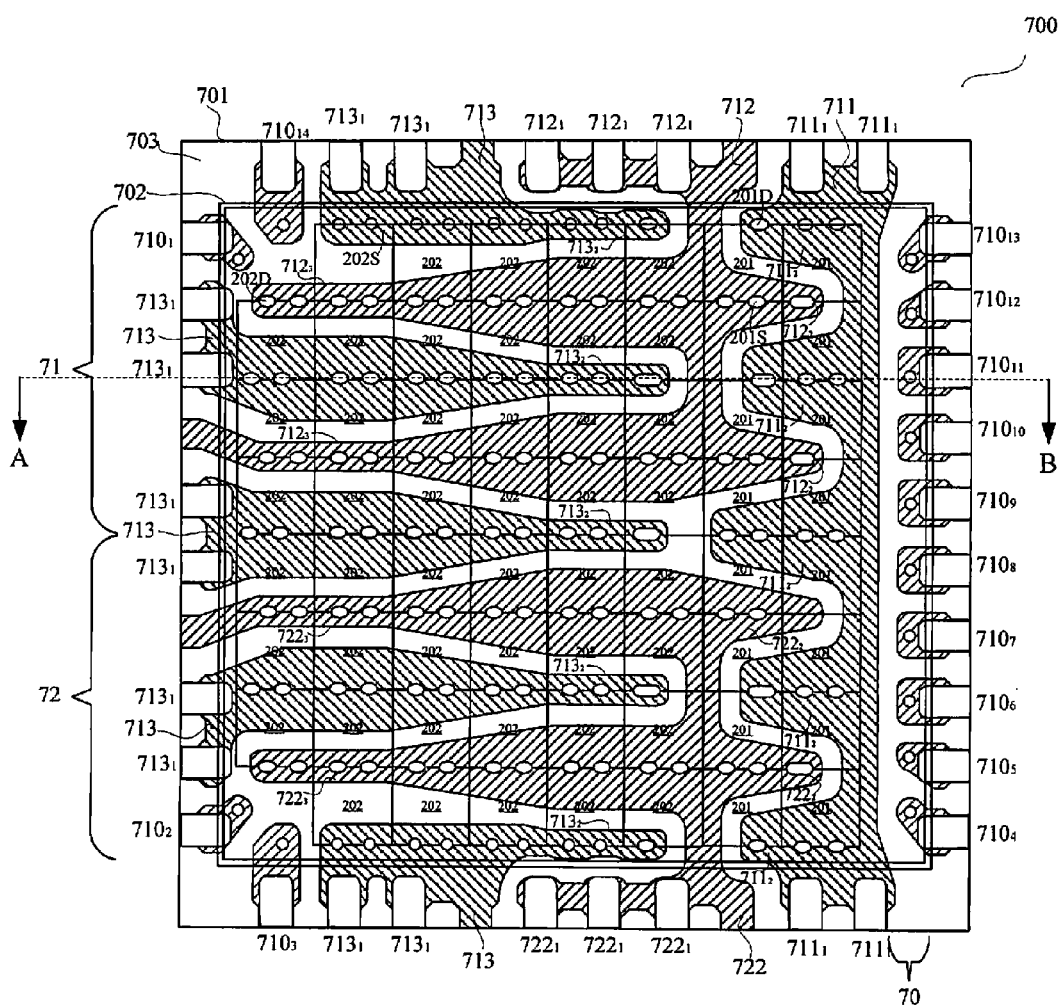
FIG. 7A is a top plan view of a two-phase switch-mode voltage regulator comprising a semiconductor flip chip die and a lead frame structure wherein the lead frame structure comprises plurality of finger shaped structures where the flip chip die are attached in accordance with one embodiment of the present invention.

Turning to FIG. 7A, a top plan view of a two-phase switch-mode voltage regulator 700 comprising a semiconductor flip chip die 702 and a lead frame structure 701 is illustrated as one embodiment of the present invention. The semiconductor flip chip die 702 and the lead frame structure 701 are encapsulated in the molding compound material 703, leaving the electrical leads 7101-71014, 7111, 7121, 7221 and 7131 exposed at the surface to communicate with the external circuits.

On the semiconductor flip chip die 702, the high side switching elements 201 and low side switching elements 202 for the first phase 71 and the second phase 72 are fabricated. Furthermore, the semiconductor flip chip die 702 can have periphery circuits 70 (not shown) fabricated on, such as the controller which comprises some or all of the control logic circuit, the under voltage lockout circuit, the current sense circuit as illustrated in FIG. 4, the floating bootstrap charging circuit as illustrated in FIG. 5A, the charging circuit as illustrated in FIG. 5B, the band gap circuit, a first level shifter circuit and a second level shifter circuit, etc. On the semiconductor flip chip die 702, contact pads are formed to receive the flip chip bumps where semiconductor are electrically coupled to and communicate with the external circuits through the lead frame structure 701.

The lead frame structure 701 is the "metal skeleton", providing the mechanical support to the semiconductor flip chip die 702 and electrical communication between the circuits on the semiconductor flip chip die 702 and the external circuits. The lead frame structure 701 comprises several parts 711, 712, 722 and 713 each having a plurality of finger shaped structures extended outward. At the region for the first phase 71 of the two-phase switch-mode voltage regulator 700, the lead frame structure 701 comprises a first part 711, a second part 712 and a third part 713. At the region for the second phase 72 of the two-phase switch-mode voltage regulator 700, the lead frame structure 701 also comprises a first part 711, a second part 722 and a third part 713. The first phase 71 and the second phase 72 share the same first part 711 which acts as the input voltage node (VIN) and the third part 713 which acts as the ground node (GND). The first part 711 comprises a first plurality of finger shaped structures 7112 extended unilaterally to the left where the high side switching elements 201 have their input contact pads (IN) 201D electrically connected through the flip chip bumps. The second part 712 comprises a second plurality of finger shaped structures 7122 extended unilaterally to the right where the high side switching elements 201 have their switch contact pads (SW) 201S electrically connected through the flip chip bumps. The second part 712 further comprises a third plurality of finger shaped structures 7123 extended unilaterally to the left where the low side switching elements 202 have their switch contact pads (SW) 202D electrically connected through the flip chip bumps. The third part 713 comprises a fourth plurality of finger shaped structures 7132 extended unilaterally to the right where the low side switching elements 202 have their ground contact pads (GND) 202S electrically connected through the flip chip bumps. The first plurality of finger shaped structures 7112 and the second plurality of finger shaped structures 7122 are arranged to form an inter-digital pattern. The third plurality of finger shaped structures 7123 and the fourth plurality of finger shaped structures 7132 are also arranged to form an inter-digital pattern. The configuration is the same at the region for the second phase 72.

Electrical leads 7101-71014, 7111, 7121, 7221 and 7131 are formed on the lead frame structure 701 and exposed at the surface of the molding compound material 703 to electrically couple the semiconductor flip chip die 702 with the external circuits through the flip chip bumps. On the first part 711, electrical leads 7111 are formed to receive the input voltage as the input voltage node VIN. On the second part 712 and 722, electrical leads 7121 are formed as the switch node (SW1) for the first phase 71 and electrical leads 7221 are formed as the switch node (SW2) for the second phase 72 respectively. On the third part 713, electrical leads 7131 are formed as the ground node (GND). Other electrical leads 7101-71014 are formed to be electrically coupled to the gate drivers of switching elements and the peripheral circuits to function as the other I/O electrical nodes such as the drive signal node PWM1 and PWM2 through the input signal metal bus 602 running across the semiconductor die 702, the power supply nodes (VDD, BST1, BST2) through the power supply metal bus running across the semiconductor die 702 coupled to deliver correct voltages to the gate drivers, the dead time control node (DT), the current sense node (CS), the phase control nodes (EN2, SYNC1), etc.

For the multi-phase switch-mode voltage regulator which comprises more than two phases, the layout comprises more repeated parts as shown as part 71. In other words, the lead frame structure comprises repeated parts of 711, 712 and 713 (or 711, 722 and 713) each comprising plurality of finger shaped structures wherein every two of the plurality of finger shaped structures are arranged to form the inter-digital pattern as shown in FIG. 7 where the switching elements for each phase is electrically coupled to the lead frame structure 701 through flip chip bumps.

Figure 7B:
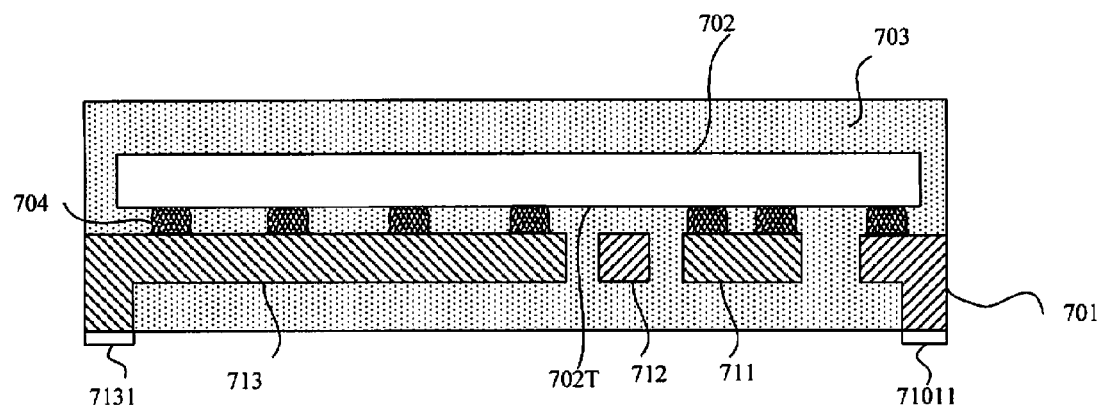
FIG. 7B shows the cross-sectional view of flip chip integrated circuit of FIG. 7A taken along AB axis.

Now referring to FIG. 7B, a cross-sectional view of flip chip integrated circuit 700 of FIG. 7A taken along AB axis is illustrated. The semiconductor flip chip die 702 is faced down with top surface 702T bonded to the lead frame structure 701 by means of flip chip bumps 704. The first part 711, the second part 712, the third part 713 and the structure for I/O electrical lead 71011 of the lead frame structure 701 are shown respectively, and are bonded to the semiconductor flip chip die 702 through the flip chip bumps 704. Both the semiconductor flip chip die 702 and the lead frame structure 701 are encapsulated by molding compound material 703, leaving the electrical leads 7111 and 71011 exposed at the surface. The flip chip integrated circuit 700 for multi-phase switch-mode voltage regulator can be encapsulated into a quad flat leadless (QFN) package in one embodiment. The lead frame structure 701 can also be a leaded lead frame structure such as small outline package (SOP), shrink small outline package (SSOP) and thin shrink small outline package (TSSOP), or any suitable package types.

Figure 8:
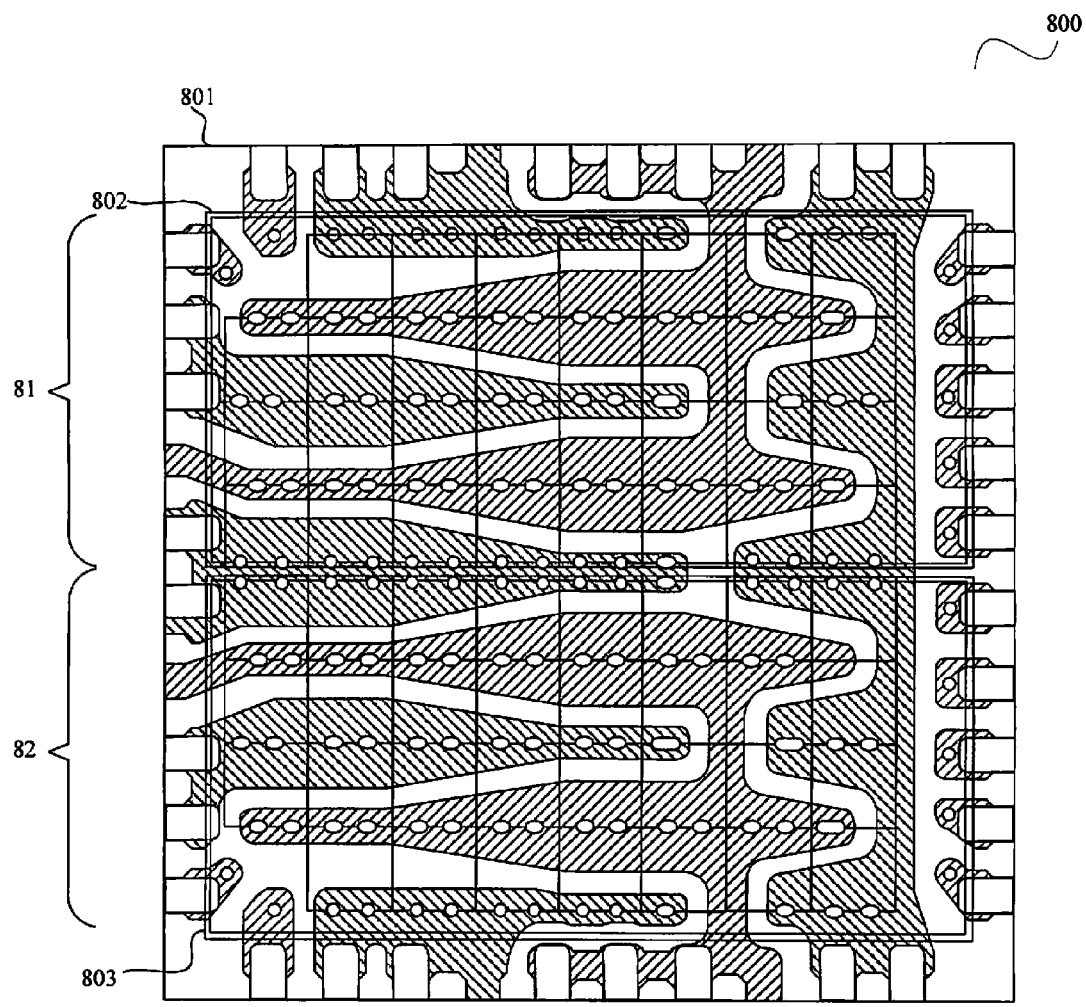
FIG. 8 is a top plan view of a two-phase switch-mode voltage regulator comprising at least two semiconductor flip chip dies and a lead frame structure in accordance with one embodiment of the present invention.

Turning to FIG. 8, a top plan view of a two-phase switch-mode voltage regulator 800 comprising at least two semiconductor flip chip dies 802, 803 and a lead frame structure 801 is illustrated as one embodiment of the present invention. In this configuration, the switching elements for the first phase 81 and the second phase 82 are fabricated on two separated semiconductor flip chip dies 802 and 803 respectively. In the multi-chip package for the two-phase switch-mode voltage regulator, the semiconductor flip chip dies 802 and 803 are placed on one side of the lead frame structure in one embodiment. The semiconductor flip chip dies 802 and 803 can also be vertically stacked and bonded onto both sides of the lead frame structure in another embodiment.

Figure 9:
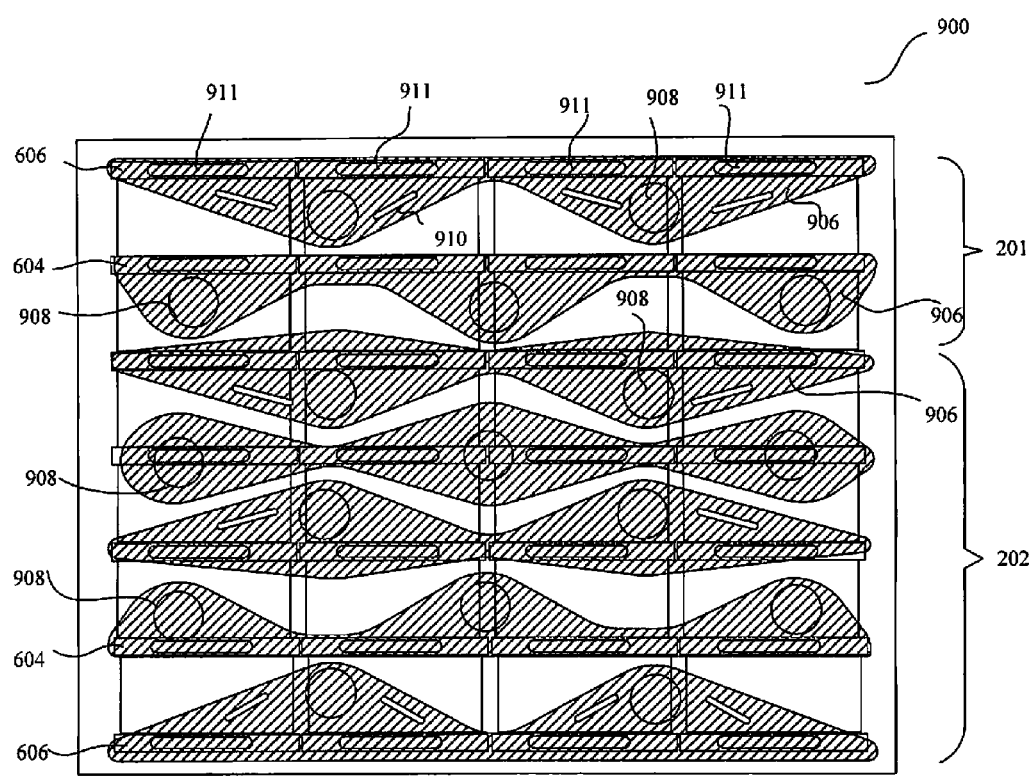
FIG. 9 is a top plan view of part of the multi-phase switch-mode voltage regulator flip chip die for one phase where UBM layers and interconnection balls are deposited in accordance with one embodiment of the present invention.

Now referring to FIG. 9, a top plan view for each phase as a part of a multi-phase switch mode voltage regulator flip chip 900 is illustrated. On the multi-phase switch mode voltage regulator flip chip, for each phase, an array of high side switching elements 201 and an array of low side switching elements 202 are fabricated. Each switching element includes a source metal power bus 604 and a drain metal power bus 606. Openings are etched along each source metal power bus 604 and each drain metal power bus 606 that form contact pads 911. Next, multi-layer under bump metallization (UBM) power buses, each including a large thick copper layer 906 shown in cross-hatched areas is placed over contact pads 911. In one embodiment, a number of stress relief slots or cuts 910 are formed on the surface of thick copper layer 906 for both thermal and mechanical stress relief. As shown, interconnection balls 908 as flip chip bumps are deposited on thick copper layer 906 either directly over contact pads 911 or on the extended portion of multi-layer UBM power bus. Accordingly, multi-layer UBM power buses and interconnection balls 908 function as I/O electrical nodes that provide electrical communications and operations between the switching elements and the external circuits by bonding to the lead frame structure.

Modifications and variations of the present invention are possible in light of the above teachings. It is therefore to be understood that within the scope of the appended claims the invention may be practiced otherwise than as specifically described. It should be understood, of course, the foregoing disclosure relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

Although the integrated circuits discussed above are multi-phase switch mode voltage regulator, the present invention is also applicable to class D audio amplifiers, motor controls, and Cold Cathode Fluorescent Lamp (CCFL) drivers, and similar power devices.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. A multi-phase switch-mode voltage regulator comprising:
    a semiconductor flip chip die, comprising a multi-phase switch-mode voltage regulator circuit, wherein the multi-phase switch-mode voltage regulator comprises a plurality of phase circuits, with each phase circuit comprising at least one array of switching elements each comprising a MOSFET transistor and a gate driver dedicated to drive said MOSFET transistor so that a gate coupling resistance capacitance product is reduced; and
    a lead frame structure having said semiconductor flip chip die attached on, comprising at least two parts, each part having a plurality of finger shaped structures extended unilaterally outward wherein the two parts are arranged to form an inter-digital pattern;
    wherein each said MOSFET transistor comprises a plurality of discrete DMOS elements laid out in parallel to one another;
    wherein each phase circuit on said semiconductor flip chip die further comprises:
        at least one power supply metal bus electrically coupled to provide supply voltages to said plurality of gate drivers; and
        at least one input signal metal bus electrically connected to said plurality of gate drivers;
    wherein each switching element further comprises a metal gate driver bus electrically coupled to the gates of said plurality of discrete DMOS elements;
    wherein each said switching element further comprises:
        a drain metal line electrically connected to drain electrodes of said plurality of discrete DMOS elements; and
        a source metal line electrically connected to source electrodes of said plurality of discrete DMOS elements, said source electrodes substantially parallel to said drain electrodes that forms said inter-digital metallization pattern;
    wherein said at least one array of switching elements further comprises:
        an array of high side switching elements each comprising an input contact pad electrically coupled to said drain metal line and a switch contact pad electrically coupled to said source metal line; and
        an array of low side switching elements, each comprising a switch contact pad electrically coupled to said drain metal line and a ground contact pad electrically coupled to said source metal line; and
    wherein said lead frame structure comprises:
        a first part, comprising a first plurality of finger shaped structures extended unilaterally to a first side where the high side switching elements have their input contact pads electrically connected;
        at least one second part each for one phase circuit, each comprising a second plurality of finger shaped structures extended unilaterally to a second side where the high side switching elements in that phase circuit have their switch contact pads electrically connected, and a third plurality of finger shaped structures extended unilaterally to said first side where the low side switching elements in that phase circuit have their switch contact pads electrically connected; and
        a third part comprising a fourth plurality of finger shaped structures extended unilaterally to said second side where the low side switching elements have their ground contact pads electrically connected; and
    where the first plurality of finger shaped structures and the second plurality of finger shaped structures are arranged to form an inter-digital pattern, and the third plurality of finger shaped structures and the fourth plurality of finger shaped structures are also arranged to form an inter-digital pattern.

2. The multi-phase power switch-mode voltage regulator circuit in claim 1 wherein said plurality of finger shaped structures are substantially parallel to said input contact pad, said switch contact pad and said ground contact pad so that:
    said plurality of finger shaped structures are electrically coupled to pick up the currents generated by each switching element at said switch contact bus by a plurality of flip chip bumps; and
    said plurality of finger shaped structures are electrically coupled to deliver said input voltage to said switching elements at said input contact bus by means of flip chip bumps.

3. The multi-phase power switch-mode voltage regulator circuit in claim 1 wherein said semiconductor flip chip die and said lead frame structure are encapsulated by a molding compound material into a quad flat package with no leads (QFN).

4. The multi-phase power switch-mode voltage regulator circuit in claim 1 wherein said semiconductor flip chip die and said lead frame structure are encapsulated by a molding compound material into a small outline package (SOP).

5. The multi-phase power switch-mode voltage regulator circuit in claim 1 wherein said semiconductor flip chip die at a region for each phase circuit further comprises a plurality of Under Bump Metallization (UBM) multi-layer buses disposed parallel to one another and spanning substantially across the entire length of that phase circuit and electrically coupled to said array of switching elements, further comprising a thick metal layer configured in a geometric shape having interconnection balls posited thereupon.

6. The multi-phase power switch-mode voltage regulator circuit in claim 1 further comprises at least two semiconductor flip chip dies each has plurality of switching elements fabricated on, and said at least two semiconductor flip chip dies and said lead frame structures are encapsulated by molding compound material.

7. The multi-phase power switch-mode voltage regulator circuit in claim 6 wherein said at least two semiconductor flip chip dies are attached on one side of said lead frame structure.

8. The multi-phase power switch-mode voltage regulator circuit in claim 6 wherein said at least two semiconductor flip chip dies are vertically stacked and bonded onto both sides of said lead frame structure.

* * * * *